(12) United States Patent
Cui et al.

(10) Patent No.: US 12,360,143 B2
(45) Date of Patent: Jul. 15, 2025

(54) INTELLIGENT ELECTRONIC DEVICE AND METHOD THEREOF

(71) Applicant: Accuenergy (Canada) Inc., Toronto (CA)

(72) Inventors: Shaohang Cui, Toronto (CA); Ketao Li, Toronto (CA); Yufan Wang, Toronto (CA); Liang Wang, Toronto (CA)

(73) Assignee: Accuenergy (Canada) Inc., Toronto (CA)

( * ) Notice: Subject to any disclaimer, the term of this patent is extended or adjusted under 35 U.S.C. 154(b) by 228 days.

(21) Appl. No.: 18/075,376

(22) Filed: Dec. 5, 2022

(65) Prior Publication Data

US 2024/0183888 A1 Jun. 6, 2024

(51) Int. Cl.
G08B 21/00 (2006.01)
G01R 22/06 (2006.01)
H04B 10/40 (2013.01)

(52) U.S. Cl.
CPC ........... *G01R 22/063* (2013.01); *H04B 10/40* (2013.01)

(58) Field of Classification Search
CPC ...... G06F 16/972; G01D 4/004; G01D 4/002; G06Q 50/06; H04L 67/06; H04L 67/12; H04W 4/38; G01R 19/2513; G01R 22/063; G01R 22/10; Y02B 90/20; Y04S 20/30; H04B 10/40
USPC ......................... 340/657, 635, 644, 653, 654
See application file for complete search history.

(56) References Cited

U.S. PATENT DOCUMENTS

| | | | | |
|---|---|---|---|---|
| 5,742,644 A | * | 4/1998 | Campana, Jr. | H04L 27/22 370/514 |
| 6,871,150 B2 | * | 3/2005 | Huber | G01R 22/00 700/291 |
| 7,072,779 B2 | * | 7/2006 | Hancock | G01R 21/133 702/60 |
| 12,000,875 B1 | * | 6/2024 | Cui | H04L 67/12 |
| 2013/0204450 A1 | * | 8/2013 | Kagan | G01D 4/004 700/291 |
| 2013/0275066 A1 | * | 10/2013 | Spanier | G01R 23/20 702/61 |
| 2015/0295705 A1 | * | 10/2015 | Khoshnood | H02J 13/00017 375/257 |
| 2017/0045570 A1 | * | 2/2017 | Oda | H02H 7/04 |

* cited by examiner

*Primary Examiner* — Anh V La
(74) *Attorney, Agent, or Firm* — Michael D. Eisenberg

(57) ABSTRACT

Provided are a method and apparatus for communication between a CPU and a Digital Signal Processor (DSP) in an Intelligent Electronic Device (IED). Specifically, the IED includes at least one analog-to-digital converter coupled to at least one sensor and configured for converting an analog signal output from the at least one sensor to digital data; a DSP coupled to the at least one analog-to-digital converter, and configured to perform digital signal processing on the signal from the at least one analog-to-digital converter; a CPU coupled to the DSP via a hardware path; wherein the DSP and the CPU are configured to communicate using a transmission protocol including a data header and a data payload based on the hardware path; wherein the data header includes a field of command identification indicating a specific communication purpose and a field of command type indicating the communication direction and frequency.

5 Claims, 7 Drawing Sheets

INTELLIGENT ELECTRONIC DEVICE AND METHOD THEREOF

FIELD OF THE INVENTION

The present disclosure generally relates to the field of Intelligent Electronic Devices for electrical utility services and, more specifically, to digital electrical power and energy meters for use in performing electrical utility services.

BACKGROUND

Monitoring electrical energy is a fundamental function within any electrical power distribution system. Electrical energy may be monitored to determine usage and power quality. A device that monitors electrical energy may be an Intelligent Electronic Device (IED).

Some IEDs may include a Digital Signal Processor (DSP) and a Central Processing Unit (CPU). The DSP computes power quality parameters from samples received from an Analog-to-Digital Converter (ADC). The CPU implements required embedded applications. The CPU and the DSP may communicate by a communication interface such as Serial Peripheral Interface (SPI).

An efficient and manageable transmission protocol between the CPU and the DSP in an IED is needed.

SUMMARY OF THE INVENTION

The embodiments of the present disclosure generally related to method and apparatus for communication between a CPU and a DSP in an IED.

In some embodiments, the present disclosure provides an IED. The IED at least one sensor configured for sensing at least one electrical parameter of electrical power distributed from an electrical distribution system to a load; at least one analog-to-digital converter coupled to the at least one sensor and configured for converting an analog signal output from the at least one sensor to digital data; a DSP coupled to the at least one analog-to-digital converter, and configured to perform digital signal processing on the signal from the at least one analog-to-digital converter; a CPU coupled to the DSP via a hardware path; wherein the DSP and the CPU are configured to communicate using a transmission protocol including a data header and a data payload based on the hardware path; wherein the data header includes a field of command identification indicating a specific communication purpose and a field of command type indicating the communication direction and frequency.

In some other embodiments, the present disclosure provides a method for time synchronization between CPU and DSP in an IED, the CPU having power grid time, the DSP having local time represented by a free running counter, the CPU communicating with the DSP via a hardware path. The method includes sending a signal to the DSP and recording a sending time represented by power grid time; receiving a latched time information represented by the free running counter from the DSP; receiving power monitoring information with time of occurrence represented by a free running counter from the DSP; computing the time of occurrence represented by the power grid time according to the sending time, the latched time information and the time of occurrence represented by the free running counter.

These and other features and aspects of the present disclosure will become fully apparent from the following detailed description of exemplary embodiments, the appended claims and the accompanying drawings.

DETAILED DESCRIPTION

Embodiments of the present disclosure will be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be construed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

As used herein, Intelligent Electronic Devices ("IEDs") can be any device that senses electrical parameters and computes data including, but not limited to, Programmable Logic Controllers ("PLCs"), Remote Terminal Units ("RTUs"), electrical power meters, protective relays, fault recorders, phase measurement units, and other devices which are coupled with power distribution networks to control and manage the distribution or consumption of electrical power.

Figure 1:
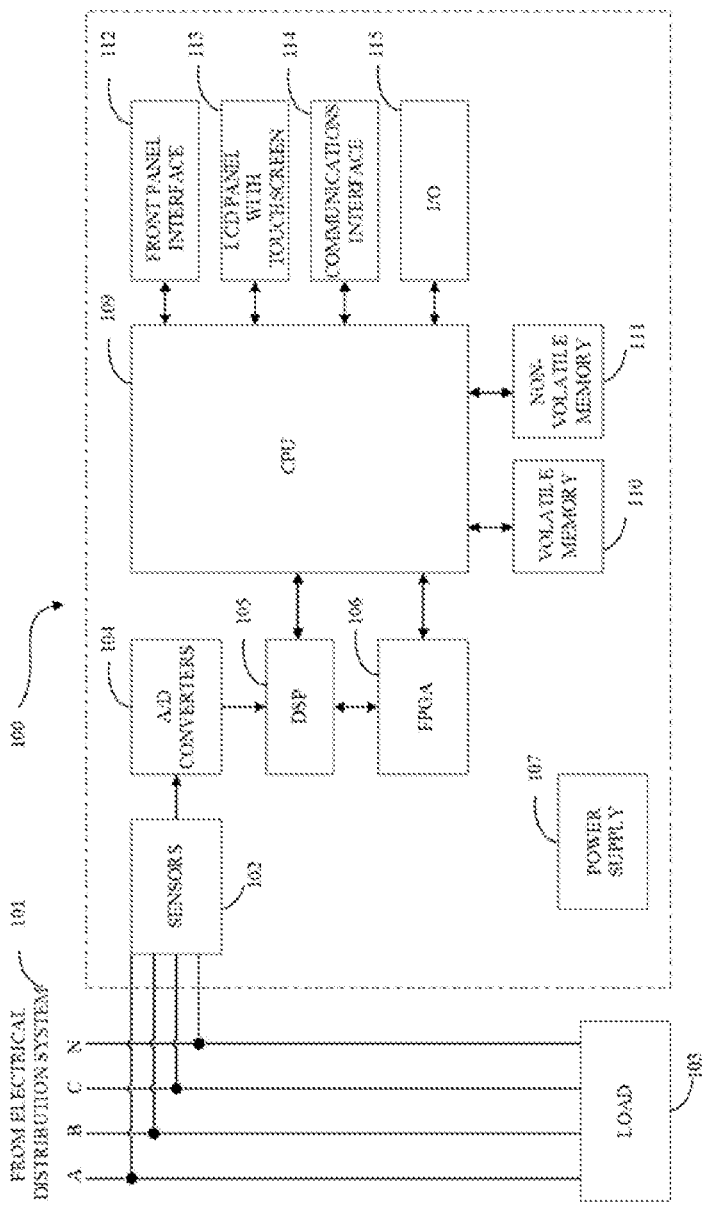
FIG. 1 is a block diagram of an example Intelligent Electronic Device according to some embodiments.

FIG. 1 is a block diagram of an Intelligent Electronic Device (IED) 100 for monitoring power usage and power quality for any metered point within an electrical distribution system 101.

The IED 100 illustrated in FIG. 1 includes multiple sensors 102 coupled with various phases A, B, C, and N (neutral) of an electrical distribution system 101, multiple analog-to-digital (A/D) converters 104, a power supply 107, volatile memory 110, non-volatile memory 111, a front panel interface 112, and a processing module that includes at least one Central Processing Unit (CPU) and/or one or more Digital Signal Processors (DSP), two of which are shown DSP 105 and CPU 109. The IED 100 also includes a Field Programmable Gate Array (FPGA) 106 which performs several functions, including acting as a communications bridge for transferring data between the various processors (105 and 109).

The sensors 102 sense electrical parameters, such as voltage and current, on incoming lines (phase A, phase B, phase C, and neutral N) of an electrical power distribution system 101 that are coupled to at least one load 103 that consumes the provided power. In one embodiment, the sensors 102 include current transformers and potential transformers, where one current transformer and one voltage transformer will be coupled to each phase of the incoming power lines. The primary winding of each transformer will be coupled to the incoming power lines and the secondary winding of each transformer will output a voltage representative of the sensed voltage and current. The output of each transformer will be coupled with the A/D converters 104 which are configured to convert the analog voltage output from the transformer to a digital signal that can be processed by the DSP 105.

In some embodiments, digital signal of DSP 105 is transmitted to a gate array, such as Field Programmable Gate Array (FPGA) 106. The digital signal is then transmitted from the FPGA 106 to the CPU 109.

The CPU 109 or DSP Processors 105 are configured to receive digital signals from the A/D converters 104 and perform the necessary calculations to determine power usage and control the overall operations of the IED 100. In some embodiments, the CPU 109 and DSP 105 may be combined into a single processor to serve the functions of each component. In some embodiments, it is contemplated to use an Erasable Programmable Logic Device (EPLD), a Complex Programmable Logic Device (CPLD), or any other programmable logic device in place of the FPGA 106. In some embodiments, the digital samples, which are output from the A/D converters 104 are sent directly to the CPU 109, effectively bypassing the DSP 105 and the FPGA 106 as a communications gateway.

The power supply 107 provides power to each component of the IED 100. In one embodiment, the power supply 107 is a transformer with its primary windings coupled to the incoming power distribution lines to provide a nominal voltage at its secondary windings. In other embodiments, power may be supplied from an independent power source to the power supply 107.

In FIG. 1, the front panel interface 112 is shown coupled to the CPU 109 which includes indicators, switches, and various inputs.

In FIG. 1, the LCD panel with touchscreen 113 is shown coupled to the CPU 109 for interacting with a user and for communicating events, such as alarms and instructions. The LCD panel with touchscreen 113 may provide information to the user in the form of alpha-numeric lines, computer-generated graphics, videos, animations, etc.

An input/output (I/O) interface 115 may be provided for receiving externally generated inputs from the LED 100 and for outputting data, such as serial data, to other devices. In one embodiment, the I/O interface 115 may include a connector for receiving various cards and/or modules that increase and/or change the functionality of the LED 100.

The IED 100 also includes volatile memory 110 and non-volatile memory 111. The volatile memory 110 will store the sensed and generated data for further processing and for retrieval when requested to be displayed at the LED 100 or from a remote location. The volatile memory 110 includes internal storage memory, such as Random-Access Memory (RAM). The non-volatile memory 111 includes removable memory, such as magnetic storage memory, optical storage memory (such as various types of CD or DVD media), solid-state storage memory, (such as a CompactFlash card, a Memory Stick, SmartMedia card, MultiMediaCard [MMC], SD [Secure Digital] memory), or any other memory storage that exists currently or will exist in the future. Such memory will be used for storing historical trends, waveform captures, event logs (including time-stamps), and stored digital samples for later download to a client application, webserver, or PC application.

In a further embodiment, the LED 100 will include a communication interface 114, also know as a network interface, for enabling communications between the IED, or meter, and a remote terminal unit or programmable logic controller and other computing devices, microprocessors, desktop computers, laptop computers, other meter modules, etc. The communication interface 114 may be a modem, Network Interface Card (NIC), wireless transceiver, or other interface. The communication interface 114 will operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocols, communication architecture, or systems currently existing or to be developed for wirelessly transmitting data.

The IED 100 may communicate to a server or other computing device via the communication interface 114. The IED 100 may be connected to a communications network (such as the Internet) by any means. For example, a hardwired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server will communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocols. The server may further include a storage medium for storing the data received from at least one IED or meter and/or storing data to be retrieved by the IED or meter.

In an additional embodiment, when a power event occurs, such as a voltage surge, voltage sag, or current short circuit, the IED 100 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform will also allow the CPU 109 to compute other electrical parameters such as harmonics, magnitudes, symmetrical components, and phasor analysis.

In a further embodiment, the IED 100 will execute an e-mail client and will send notification e-mails to the utility or directly to the customer when a power quality event occurs. This allows utility companies to dispatch crews to repair the condition. The data generated by the meters is used to diagnose the cause of the condition. The data is transferred through the infrastructure created by the electrical power distribution system. The e-mail client will utilize POP3 or another standard e-mail protocol.

The techniques of the present disclosure can be used to automatically maintain program data and provide field-wide updates upon which IED firmware and/or software can be upgraded. An event command can be issued by a user, on a schedule, or through a digital communication that will trigger the IED 100 to access a remote server and obtain the new program code. This will ensure that program data will be maintained, assuring the user that all information is displayed identically on all units.

It is to be understood that the present disclosure may be implemented in various forms of hardware, software, firmware, special purpose processors, or a combination thereof. The IED 100 also includes an operating system and application programs. The various processes and functions described herein may either be part of an application program (or a combination thereof) which is executed via the operating system.

Because some of the system components and methods depicted in the accompanying figures may be implemented using either software or firmware, it is to be further understood that the actual connections between the system components (or the process steps) may differ depending on the specific way the present disclosure is programmed. Given the teachings of the present disclosure provided herein, one of ordinary skill in the related art will be able to contemplate these and similar implementations or configurations of the present disclosure.

With reference to FIG. 1, the communication interface between CPU 109 and DSP 105 may be a Serial Peripheral Interface (SPI). In one embodiment, CPU 109 is a master device which controls a chip/slave select signal and a serial clock signal. DSP 105 is a slave device which receives and transmits data when the serial clock signal is active.

In order to make the communication between CPU 109 and DSP 105 more efficient and manageable, a transmission protocol is presented in the disclosure. Please refer to FIG. 2, which illustrates a packet structure of the transmission protocol between CPU 109 and DSP 105 according to some embodiments.

The packet 201 includes a header 203, a data header 207, a data payload, and a footer 205. The header 203 comprises a wakeup word, a packet header, a packet type/length and a packet counter.

The wakeup word in the header 203 is used to detect the beginning of a protocol packet. In some embodiments, the wakeup word could be 0x55 55 55 55.

In some embodiments, the packet header may be 0x7E 7E 7E 7E, which indicates the beginning of the actual intended message. The packet type indicates the packet 201's type. In some embodiments, the packet may be one type of a command packet, an acknowledge answer packet and an unacknowledged packet. The command packet has a unique command identification which will be discussed later.

The packet length indicates the length of a data section including a data header and a data payload. The packet counter is used to identify the missing packet, which could be increased by 1 at each transmission.

The data header 207 includes a command type and a command ID. The command type will be described in FIG. 3. The command ID is used to identify the command identification of the packet. Each packet has a unique command identification corresponding to a specific task applied to power meter or other IED. The specific task may include but not limited to DSP configuration/calibration, getting DSP started, getting DSP status, power quality event report, etc.

The footer 205 comprises a checksum, a wakeup word and a closure word. The checksum is used to detect errors in the packet 201. In some embodiments, the checksum is calculated based on all the packet content excluding the wakeup word in the footer 205, closure word, the wakeup word in the header 203, and the packet header. The wakeup word in the footer 205 is used to detect the ending of the packet. In some embodiments, the wakeup word in the footer 205 is 0x55 55 55 55. The closure word is used to bind a protocol packet. In some embodiments, the closure word is 0xE7 E7 E7 E7.

Figure 2:
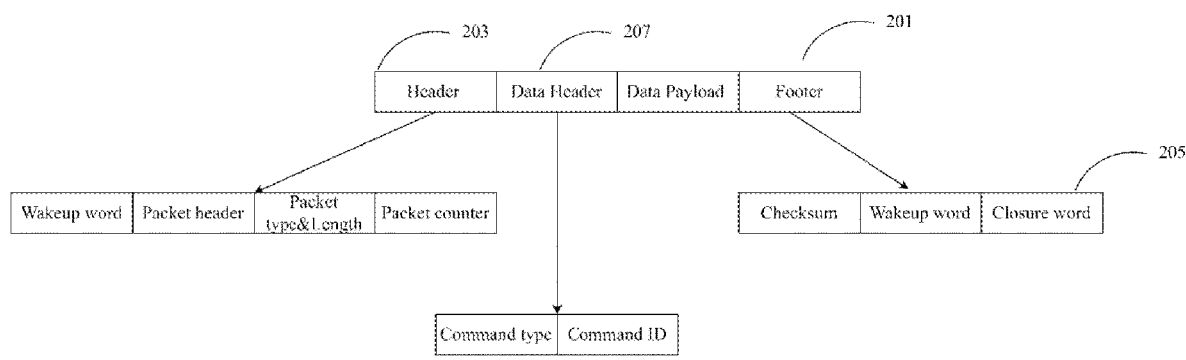
FIG. 2 is an example packet structure of the transmission protocol between CPU and DSP according to some embodiments.
Figure 3:
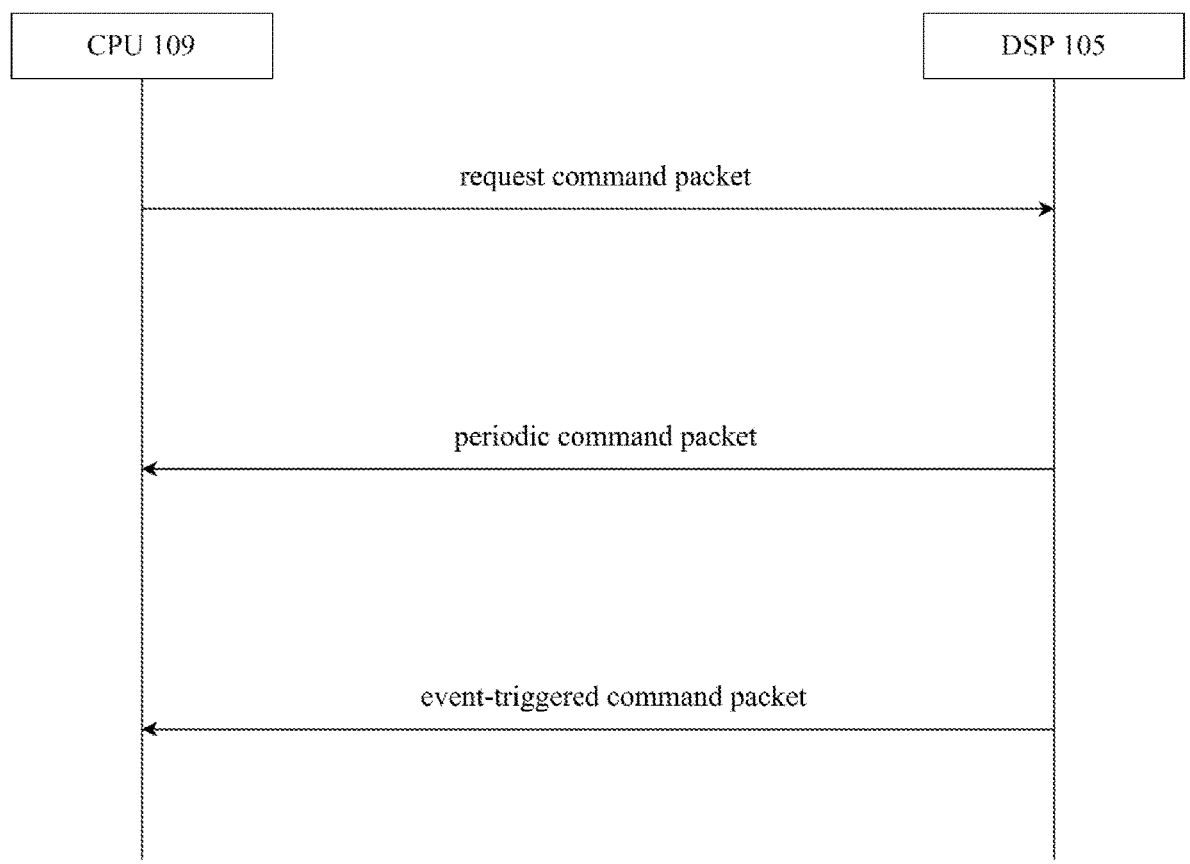
FIG. 3 is a diagram illustrating categories of command packets used between CPU and DSP according to some embodiments.

FIG. 3 illustrates categories of command packets between CPU 109 and DSP 105 according to some embodiments. There are hundreds of command packets between CPU 109 and DSP 105. For convenience, these command packets can be divided into three categories. The first type is a request command packet sent from CPU 109 to DSP 105. The second type is a periodic command packet sent from DSP 105 to CPU 109. The third type is an event-triggered command packet sent from DSP 105 to CPU 109. The request command packet, periodic command packet, event-triggered command packet can be represented using different values in the field of command type in FIG. 2.

In some embodiments, the request command packet has two subclasses. The first subclass is one-time request command packet, which can only be executed once after IED 100 starts. The second subclass is on-demand request command packet, which can be executed for any times after IED 100 starts. The one-time request command packet and on-demand request command packet can be represented using different values in the field of command type in FIG. 2.

Figure 4:
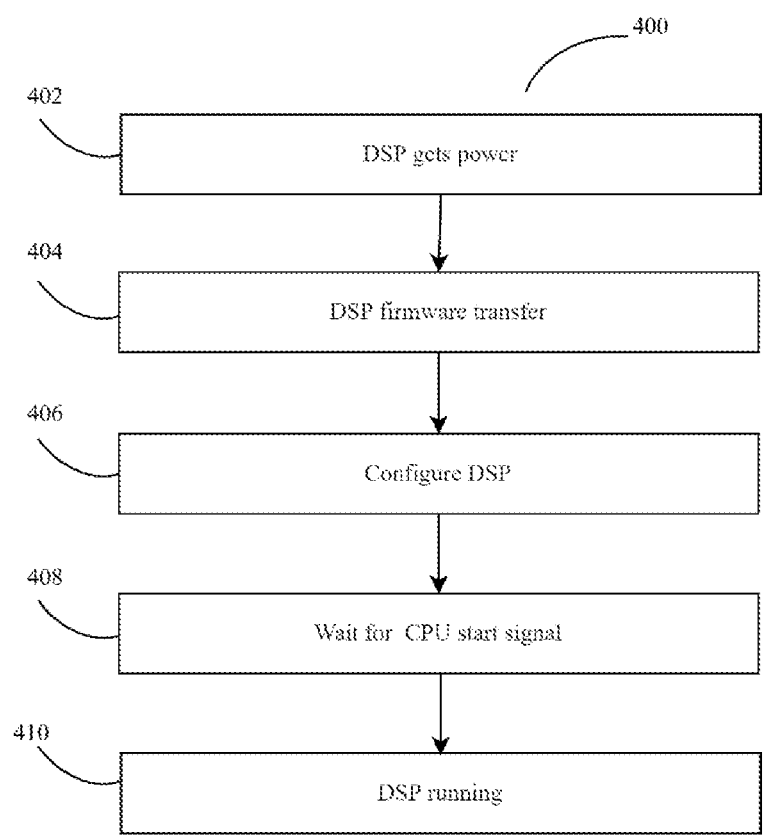
FIG. 4 is a sequence diagram illustrating an example initialization sequence of DSP according to some embodiments.

FIG. 4 illustrates the initialization sequence of DSP 105 according to some embodiments. In the first step 402, DSP 105 gets powered on. In step 404, the DSP firmware is transferred from CPU 109 to DSP 105. The DSP firmware is software that allow the DSP 105 to function and communicate with other software running on the device.

In step 406, CPU 109 configures the parameters of DSP 105. The configuration includes parameters such as primary nominal voltage, wire type, etc. A DSP_CONFIG command packet can be used to configure the parameters of DSP 105. The DSP_CONFIG command packet is one of on-demand request command packets which can be executed many times after IED 100 starts. The DSP_CONFIG command packet is described in Table 1 and Table 2 as below.

TABLE 1

| fields of DSP_CONFIG command packet | | |
| --- | --- | --- |
| command type | Command ID | Data payload |
| 0x01(on-demand request command) | 0x06 | Parameter |

TABLE 2 description of parameter in Table 1

| parameter | description |
|---|---|
| nominalV | primary nominal V value configure by user |
| nominalI | primary nominal I value configure by user |
| frequency | 0-50 Hz, 1-60 Hz, 2-auto |
| wire | Wire types |
| harmonicConfig | 0 for group harmonics, 1 for sub-group harmonics |

In step 408, DSP 105 waits for the start signal form CPU 105. In this step, DSP waits for a DSP_START command packet from CPU 105. DSP 105 cannot start to process the digital signal from ADC 104 until DSP 105 receives the DSP_START command packet from CPU 105.

The DSP_START command packet is one of one-time request command packets which is only executed once after IED 100 starts. The DSP_START command packet is described in Table 3 as below.

TABLE 3 fields of DSP_START command packet

| command type | Command ID | Data payload |
|---|---|---|
| 0x02(on-time request command) | 0x04 | 1(start DSP) |

Figure 5:
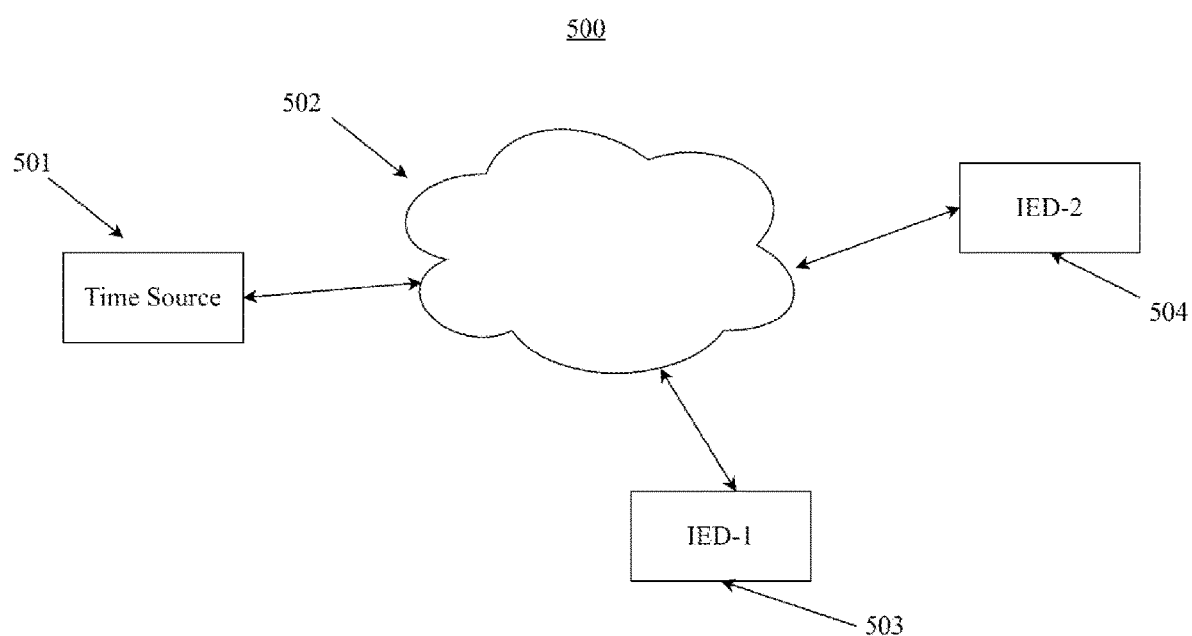
FIG. 5 is a diagram illustrating an example power grid with time synchronization according to some embodiments.

In a power grid, time synchronization signals are broadcast periodically over the network. Each power meter continually assesses its ability to remain synchronized with the incoming broadcasts. Over a brief period, each power meter learns how its internal timing differs from that of the broadcast source and adjusts its timekeeping to compensate. Very accurate time synchronization is achieved with this method. FIG. 5 illustrates an example power grid 500 with time synchronization, according to some embodiments.

The power grid 500 includes a time source 501, a transmission network 502 and some IEDs such as IED-1 503 and IED-2 504. The time source 501 includes NTP (Network Time Protocol) server, PTP (Precision Time Protocol) server, or GPS (Global Positioning System) receiver. The time source sends message with the power grid time. The transmission network 502 may be based on coaxial, fiber, or radio wave. IEDs receive the synchronization data sent from time source 401 through transmission network 502. After time synchronization, every IED in the power grid 500 keeps the same time as the power system grid.

Figure 6:
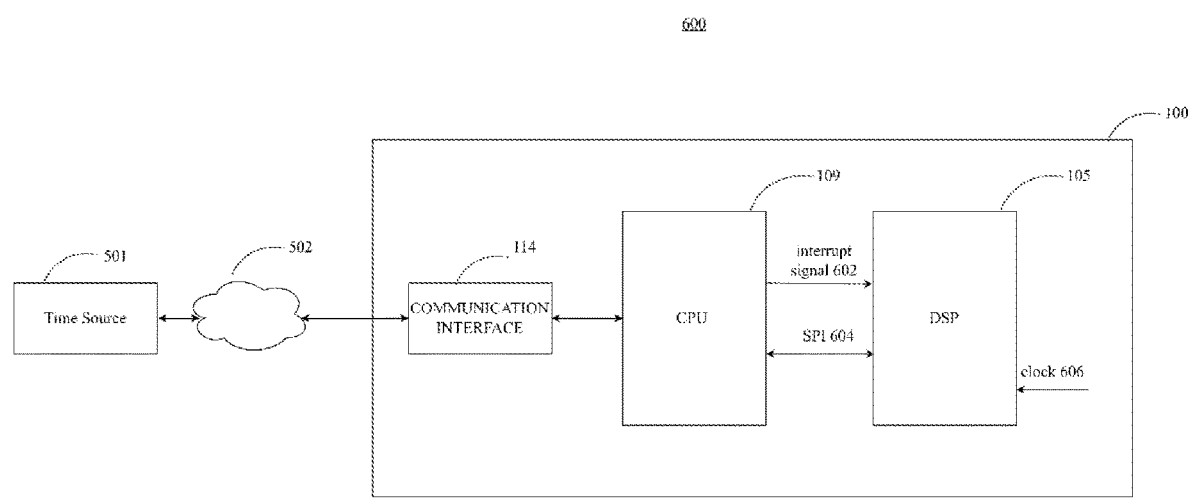
FIG. 6 is a block diagram illustrating an example time synchronization between IED and time source according to some embodiments.

FIG. 6 illustrates time synchronization between LED 100 and time source 501 according to some embodiments. In IED 100, DSP 105 is responsible for processing the signal from ADC 104 and obtaining various electrical parameters such as RMS (Root Mean Square) voltage, energy, harmonic, frequency. CPU 109 runs some applications such as user interface. Due to hardware limitation, in FIG. 6, DSP 109 cannot access the synchronization data in power grid 500 such as NTP and PTP. Instead, DSP 109 can only access a clock 606 with a fixed frequency, e.g., 100 kHz. The clock 606 may come from FPGA 106. CPU 109 can access the synchronization data in power grid 500 and keep the latest power grid time. DSP 109 may access a FRC (Free Running Counter) clocked by the clock 606. The FRC time is relative time (counter value) which represents a period between the current time and FRC starting time. FRC may be part of DSP 109 or part of FPGA 106.

Some power monitoring information measured by DSP 105 are generated with a timestamp of FRC. DSP 105 can use the data measured to form a command packet according to FIG. 2. Then DSP 105 sends the command packet to CPU 109. After receiving the command packet, CPU 109 needs to transfer the FRC time in the command packet to the time of the power grid kept by CPU 109.

For example, frequency_10 s command packet is one of periodic command packets sent from DSP 105 to CPU 109. The frequency_10 s command packet carries frequency value measured in 10 seconds and the FRC time when the measurement starts. The frequency_10 s command packet can be sent from DSP 105 to CPU 109 every 10 seconds.

TABLE 4 fields of frequency_10 s command packet

| command type | Command ID | Data payload |
|---|---|---|
| 0x03(periodic command packet) | 0x0F | Frequency value, FRC time when the measurement starts |

A COM_TRANSIENT command packet is one of event-triggered command packets sent from DSP 105 to CPU 109. The COM_TRANSIENT command packet carries transient voltage information and the FRC time when a transient event starts. The COM_TRANSIENT command packet is sent from DSP 105 to CPU 109 when the transient event happens.

TABLE 5 fields of COM_TRANSIENT command packet

| command type | Command ID | Data payload |
|---|---|---|
| 0x04(event-triggered command packet) | 0x24 | Transient voltage value, FRC time when the transient event happens |

Figure 7:
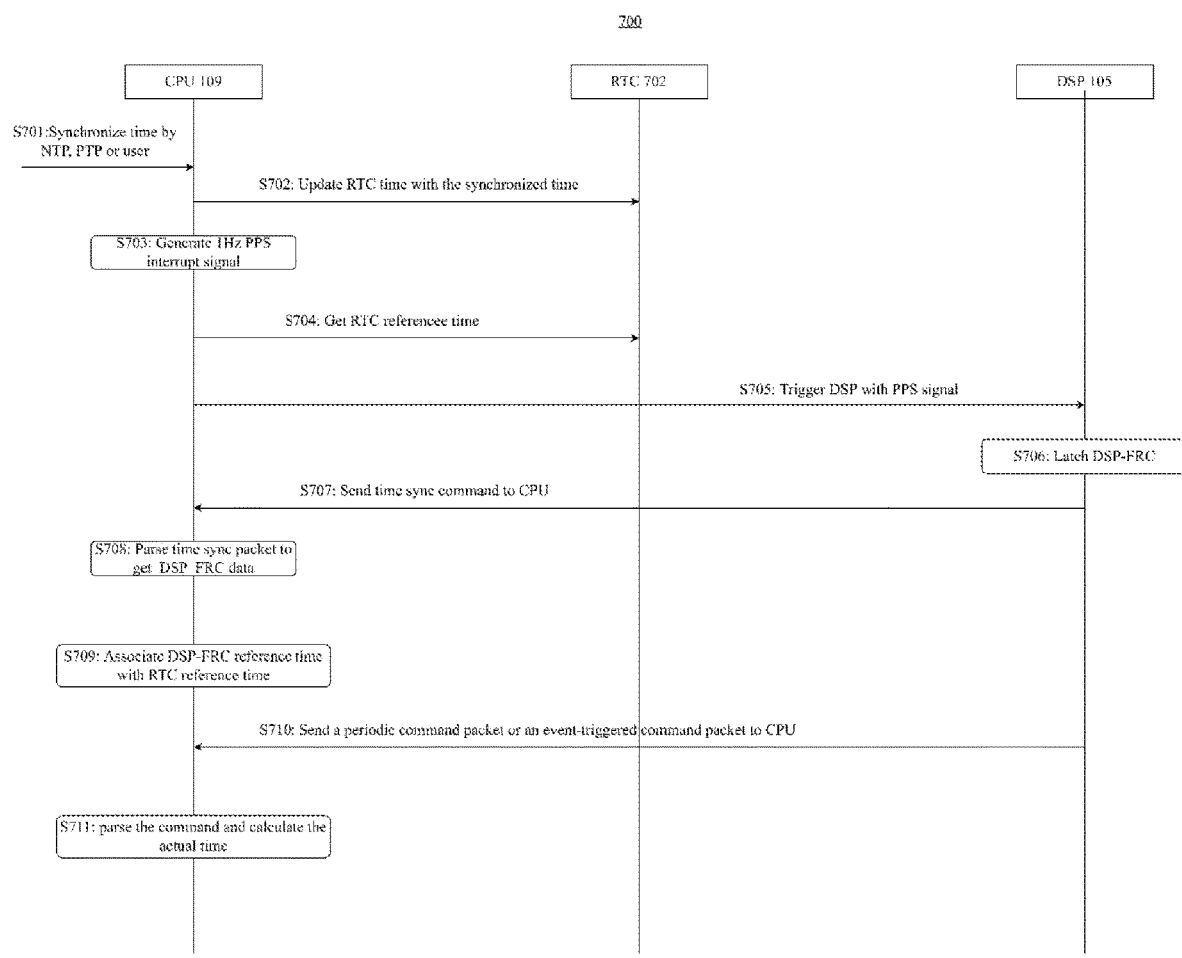
FIG. 7 is a sequence diagram illustrating an example sequence of time synchronization between CPU and DSP in IED 100 according to some embodiments.

FIG. 7 illustrates an example sequence of time synchronization between CPU 109 and DSP 105 in IED 100, according to some embodiments.

In FIG. 7, IED 100 have an internal clock such as a RTC 702 (Real-Time Clock) which CPU 109 can access. After CPU 109 receives the synchronization data such as NTP and PTP, RTC time will be updated accordingly. RTC time may be changed slightly from time to time to keep same as power grid time. DSP FRC keep increasing with a fixed frequency.

In step S701, CPU 109 synchronize the time of IED 100 by NTP, PTP or user's configuration. NTP or PTP may be transferred from time source 501 through internet. CPU 109 parses the time information carried with NTP or PTP packet to get the accurate power grid time. Then CPU 109 configure the time of IED 100 to the power grid time. In some embodiments, a user can configure the time of IED 100 to power grid time through user interface manually. In both cases, power grid time is the synchronized time of IED 100.

In step S702, CPU 109 updates RTC time with the synchronized time. In some embodiments, CPU 109 compares the synchronized time with the current RTC time and RTC time will be updated to synchronized time if they are different.

In step S703, CPU 109 generates an interrupt signal 602 which is used to notify DSP 105 that it should latch DSP FRC. The interrupt signal 602 for DSP 105 can be responded by DSP 105 more quickly. In some embodiments, the interrupt signal may be 1 Hz PPS (Pulse Per Second) interrupt signal. It should be recognized that the PPS interrupt signal may be any signal sent to notify DSP 105 that it should latch DSP FRC except interrupt signal.

In step S704, CPU 109 gets the current RTC time $T_{LATCH\_RTC}$ and records it. For example, $T_{LATCH\_RTC}$=767354 s.

In step S705, CPU 109 sends the PPS signal to trigger DSP 105 to latch DSP FRC.

In step S706, DSP 105 latches the current DSP FRC $T_{LATCH\_FRC}$. For example, $T_{LATCH\_FRC}$=25000.

In step S707, DSP 105 builds a time synchronization command packet with current DSP FRC as data payload according to FIG. 2 and sends time synchronization command packet to CPU 109.

Time synchronization command packet is one of periodic command packets sent from DSP 105 to CPU 109. The time sync command packet carries the current DSP FRC. The time synchronization command packet can be sent from DSP 105 to CPU 109 every 1 seconds.

TABLE 6 fields of time synchronization command packet

| command type | Command ID | Data payload |
|---|---|---|
| 0x03(periodic command packet) | 0x08 | current DSP FRC |

In step S708, CPU 109 parses the time synchronization command packet to get the current DSP FRC $T_{LATCH\_FRC}$.

In step S709, CPU 109 associate the current DSP FRC $T_{LATCH\_FRC}$ with the current RTC time $T_{LATCH\_RTC}$. CPU 109 will consider that the DSP FRC $T_{LATCH\_FRC}$ represents the same time as the current RTC time $T_{LATCH\_RTC}$.

In step S710, DSP 105 sends a periodic command packet or an event-triggered command packet to CPU 109. The periodic command packet or event-triggered command packet carries power monitoring information measured by DSP 105. The periodic command packet or event-triggered command packet also carries the timestamp represented by DSP FRC $T_{EVENT\_FRC}$. For example, the event-triggered command packet is COM_TRANSIENT command packet and $T_{EVENT\_FRC}$=75000.

In step S711, CPU 109 parses the COM_TRANSIENT command packet and get DSP FRC $T_{EVENT\_FRC}$. Then CPU 109 will calculate the power system time corresponding to $T_{EVENT\_RTC}$ as follows:

$$T_{EVENT\_RTC} = T_{LATCH\_RTC} + (T_{EVENT\_FRC} - T_{LATCH\_FRC})/f$$

Where f is the frequency of the input clock 606 of DSP FRC.

If f is 100 kHz, $T_{EVENT\_RTC}$=767354+(75000−25000)/100,000=767354.5 s

After $T_{EVENT\_RTC}$ is obtained, CPU 109 will send $T_{EVENT\_RTC}$ and transient voltages values to users for power quality analysis. And users can take actions to maintain the power quality of the power grid.

CPU 109 will process the packet from DSP 105 and get the power quality information. Then the power quality information will be displayed in LCD 113 or sent to remote server through communication interface 114. The technician will analyze the power quality information and measures will be taken to keep the stable power quality in electrical distribution system 101 if needed.

Embodiments of the teachings of the present disclosure have been described in an illustrative manner. It is to be understood that the terminology, which has been used, is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. An Intelligent Electronic Device (IED) comprising:
   at least one sensor configured for sensing at least one electrical parameter of electrical power distributed from an electrical distribution system to a load;
   at least one analog-to-digital converter coupled to the at least one sensor and configured for converting an analog signal output from the at least one sensor to digital data;
   a Digital Signal Processor (DSP) coupled to the at least one analog-to-digital converter, and configured to perform digital signal processing on the the digital data from the at least one analog-to-digital converter;
   a CPU coupled to the DSP via a hardware path; and
   wherein the DSP and the CPU are configured to communicate using a transmission protocol comprising a packet structure, the packet structure including:
   a header comprising a wakeup word, a packet header, a packet type, a packet length, and a packet counter;
   a data header including a field of command identification indicating a specific communication purpose and a field of command type indicating the communication direction and frequency;
   a data payload; and
   a footer comprising a checksum, an ending wakeup word, and a closure word;
   wherein the command type comprises:
   a request command packet sent from the CPU to the DSP;
   a periodic command packet sent from the DSP to the CPU; and
   an event-triggered command packet sent from the DSP to the CPU.

2. The IED of claim 1, wherein the request command sent from the CPU to the DSP comprises at least one of:
   an on-demand request command packet sent from the CPU to the DSP configured to be executed multiple times after the IED starts; and
   a one-time request command packet sent from the CPU to the DSP configured to be executed only once after the IED starts.

3. The IED of claim 2, wherein the one-time request command packet comprises a DSP_START command packet having a command type value of 0x02 and a command ID value of 0x04, wherein the DSP_START command packet is configured to trigger the DSP to start processing the digital data from the analog-to-digital converter.

4. The IED of claim 2, wherein the on-demand request command packet comprises a DSP_CONFIG command packet having a command type value of 0x01 and a command ID value of 0x06, wherein the DSP_CONFIG command packet includes configuration parameters comprising primary nominal voltage, wire type, and harmonic configuration.

5. The IED of claim 1, wherein the periodic command packet comprises a frequency measurement command packet having a command type value of 0x03 and a command ID value of 0x0F, configured to be sent from the DSP to the CPU every 10 seconds with frequency measurement data; and the event-triggered command packet comprises a transient voltage command packet having a command type value of 0x04 and a command ID value of 0x24, configured to be sent from the DSP to the CPU when a transient voltage event is detected.

* * * * *